United States Patent [19]
Huang et al.

[11] Patent Number: 6,011,289
[45] Date of Patent: Jan. 4, 2000

[54] METAL OXIDE STACK FOR FLASH MEMORY APPLICATION

[75] Inventors: Richard J. Huang; Lewis Shen, both of Cupertino, Calif.

[73] Assignee: Advanced Micro Devices, Inc., Sunnyvale, Calif.

[21] Appl. No.: 09/154,073

[22] Filed: Sep. 16, 1998

[51] Int. Cl.[7] .................................................. H01L 29/788
[52] U.S. Cl. ...................... 257/321; 257/315; 257/317; 257/319; 365/185.11; 438/264; 438/286
[58] Field of Search ...................... 257/315, 317, 257/319, 321; 365/185.11, 185.13; 438/264, 286

[56] References Cited

U.S. PATENT DOCUMENTS

| | | |
|---|---|---|
| 5,095,345 | 3/1992 | Gill et al. ................................. 257/315 |
| 5,147,820 | 9/1992 | Chittipeddi et al. . |
| 5,346,842 | 9/1994 | Bergemont . |
| 5,350,698 | 9/1994 | Huang et al. . |
| 5,527,727 | 6/1996 | Kim . |
| 5,536,668 | 7/1996 | An et al. . |
| 5,595,992 | 1/1997 | Tigelaar et al. . |
| 5,607,871 | 3/1997 | Han . |
| 5,614,747 | 3/1997 | Ahn et al. . |
| 5,620,615 | 4/1997 | Keller . |
| 5,620,913 | 4/1997 | Lee . |
| 5,652,161 | 7/1997 | Ahn . |
| 5,710,454 | 1/1998 | Wu . |
| 5,714,412 | 2/1998 | Liang et al. . |
| 5,862,082 | 1/1999 | Dejenfelt et al. ................... 365/185.33 |
| 5,907,188 | 5/1999 | Nakajima et al. ....................... 257/751 |

*Primary Examiner*—Valencia Martin-Wallace

[57] ABSTRACT

In order to alleviate lifting problems and to reduce the height of the stack, a tungsten layer is formed on a interpoly dielectric layer, such as an ONO layer, which separates the conductive control gate from a polysilicon floating gate that is in turn formed on a tunnel oxide layer. The tungsten layer is protected by the provision of a tungsten silicide cap which is formed over the tungsten layer and which therefore prevents oxidation of the metal. The two tungsten based layers are such as to replace the second polysilicon layer which is normally used to form the floating gate.

8 Claims, 3 Drawing Sheets

METAL OXIDE STACK FOR FLASH MEMORY APPLICATION

FIELD OF THE INVENTION

The present invention generally relates to a nonvolatile memory semiconductor device comprising a stack gate electrode, such as that used in flash memory applications. More specifically, the present invention relates to a metal oxide stack with improved resistance to lifting and a reduced stack height.

BACKGROUND ART

As integrated circuit devices have become smaller, it is increasingly important to ensure that functional and reliable connections between integrated circuit devices and conductor elements within the integrated circuits can be readily and efficiently achieved and manufactured while maintaining the required miniaturization. In keeping with this requirement, connections in integrated circuits in which Metal Oxide Semiconductor Field Effect Transistors (MOSFETs) are used, are often made through the use of polycide gate electrodes. Commonly, the polycide gate electrode is a tungsten silicide polycide gate electrode formed of a tungsten silicide upper layer and a polysilicon lower layer which in turn resides upon a Metal Oxide Semiconductor Field Effect Transistor (MOSFET) gate oxide layer.

Although tungsten silicide polycide gate electrodes within Metal Oxide Semiconductor Field Effect Transistors (MOSFETs) provide good surfaces onto which contact with conductor elements can be established, these types of arrangements tend to suffer from various drawbacks. For example, attempts to form layers of tungsten silicide on polysilicon surfaces has resulted in adhesion problems whereby the silicide layer has exhibited a tendency to lift and thus reduce the production efficiency of such arrangements. An additional problem resides in that tungsten silicide polycide gate electrodes also tend to suffer from excess fluorine migration. This fluorine originates from tungsten hexafluoride, which is one of the materials used in chemical vapor deposition (CVD) of the tungsten silicide layer, and tends to occur between the tungsten silicide layer and the polysilicon layer/oxide layer interface therebelow, under high temperature annealing. This results in the thickness of the gate oxide layer having to be increased resulting in an increased stack height.

A further problem which is encountered with this particular type of arrangement resides in that dopants from within the polysilicon layer, tend to redistribute during the thermal processing of the tungsten silicide polycide gate electrode. A yet further problem resides in that the tungsten silicide layers exhibit a high resistivity when formed upon large grain polysilicon layers.

In connection with the above mentioned problems, a method of forming a gate electrode for multiple polysilicon layer has been disclosed in U.S. Pat. No. 5,350,698 issued to Huang et al. This reference discloses the formation of multiple amorphous silicon layers which are each separated by a silicon oxide layer, and which are subsequently annealed to form polysilicon layers. An optional terminal tungsten silicide layer is also disclosed.

This arrangement is directed to limiting the channeling of ion implants which occurs through single polysilicon layers of equivalent thickness. Multiple amorphous silicon layers are discloses as being preferred since as a result of annealing, they form a larger grain size than encountered with equivalent types of multiple polysilicon layer structures.

Another technique proposed in connection with these drawbacks resides in a method wherein the stacked amorphous silicon (SAS) multilayer structures are used without these interleaved silicon oxide layers. This latter type of stacked amorphous silicon (SAS) multilayer structure, when annealed to form the polysilicon layers, is intended to improve the performance of the resulting integrated circuit device. More specifically, the use of stacked amorphous silicon (SAS) multiple layer structures has, following annealing, been used to suppress boron penetration from polysilicon gate electrodes into underlying thin gate oxide layers within P-metal oxide semiconductor field effect transistors (pMOSFETs).

MOSFETs having tungsten silicide polycide gate electrodes which exhibit good diffusion barrier properties, good dopant retention properties, and good contact resistance properties, are disclosed in U.S. Pat. No. 5,710,454 issued to Wu on Jan. 20, 1998. This reference discloses a method of forming tungsten silicide polycide gate electrodes within a metal oxide semiconductor field effect transistor (MOSFET) that is directed to limiting redistribution of dopants from within the polysilicon layer of the tungsten silicide polycide gate electrode.

In accordance with the technique disclosed in Wu, a semiconductor substrate gate oxide layer is firstly formed. A first polysilicon layer is then formed on this gate oxide layer by initially forming an amorphous silicon layer and then annealing this layer in a manner which converts it to polysilicon. Subsequent polysilicon layers are then formed through a similar process. That is to say, further amorphous silicon layers are formed and then converted into polysilicon by way of annealing. A tungsten silicide layer is then formed on the uppermost polysilicon layer through the use of chemical vapor deposition (CVD). With this method, the first and second polysilicon layers have a crystallite size no greater than 0.3 microns, and have a dopant concentration of greater than 1E16 atoms $cm^3$.

While Wu's method purports to inhibit the diffusion of fluorine from the tungsten silicide layer through the thermal annealing of a stacked amorphous silicon (SAS) multilayer structure, it has nevertheless tended to suffer from the drawback that the tungsten silicide layer tends to separate, that is to say undergo lifting, from the underlying polysilicon layers, with the result that productivity is accordingly reduced.

Accordingly, there exists a need for a stack gate structure which exhibits low resistively, good resistance to layer lifting or separation, and which also permits the height of the stack to be reduced.

SUMMARY OF THE INVENTION

An advantage of the present invention is a stack gate structure for flash memory or the like type of application, which exhibits reduced resistivity, good resistance the lifting of the tungsten silicide layer and which simultaneously reduces the height of the stack.

In brief, the above advantages are achieved through an arrangement wherein, in order to alleviate lifting problems and to reduce the height of the stack, a layer of tungsten metal is formed on an interpoly dielectric layer (e.g. an ONO layer) which separates the conductive control gate from a polysilicon floating gate that is formed on a tunnel oxide layer. The metallic tungsten layer is protected by the provision of a tungsten silicide cap which is formed over the tungsten layer and which therefore prevents oxidation of the metal. The two tungsten based layers are such as to replace the second polysilicon layer which is normally used to form the floating gate and thus allow the height of the stack to be reduced.

More specifically, a first aspect of the present invention resides in a method of forming a semiconductor device comprising a gate structure, the method comprising the steps of: forming a polysilicon layer on a tunnel oxide layer; forming an interpoly dielectric layer over the polysilicion layer; forming a tungsten layer on the polysilicon layer; and forming a tungsten silicide layer on the tungsten layer.

This method further includes the steps of: removing selected portions of the polysilicon layer, the interpoly dielectric layer, the tungsten layer, the tungsten silicide layer, and the tunnel oxide layer; doping portions of an underlying substrate to form source and drain portions; and encasing the source and drain portions, and the stack of tunnel oxide, polysilicon, interpoly dielectric, tungsten and tungsten silicide in a dielectric layer. This can then followed by the step of: forming first, second and third bores through the encasing dielectric layer and filling the bores with an electrically conductive material so as to establish electrical contact with the source, the drain and the tungsten silicide layer respectively.

A second aspect of the invention resides in a semiconductor device having a gate structure comprising a polysilicon layer formed on a tunnel oxide layer; an interpoly dielectric layer formed over the polysilicion layer; a tungsten layer formed on the polysilicon layer; and a tungsten silicide layer formed on the tungsten layer.

In addition to this basic structure the gate further features source and drain portions formed by removing selected portions of the polysilicon layer, the interpoly dielectric layer, the tungsten layer, the tungsten silicide layer, and the tunnel oxide layer and doping portions of an underlying substrate to form source and drain portions; and an encasing dielectric layer formed over the source and drain portions, and the stack of tunnel oxide, polysilicon, interpoly dielectric, tungsten and tungsten silicide. The encasing layer includes first, second and third bores formed through the encasing dielectric layer so as to respectively terminate at the source, the drain and the tungsten silicide layer respectively, the first, second and third bores being filled with an electrically conductive material so as to so as to establish electrical contact with the source, the drain and the tungsten silicide layer respectively.

BRIEF DESCRIPTION OF DRAWINGS

The various features and advantages of the present invention will become more clearly understood as a detailed description of the preferred embodiments is given with reference to the appended drawings wherein.

DESCRIPTION OF THE INVENTION

Figure 1:
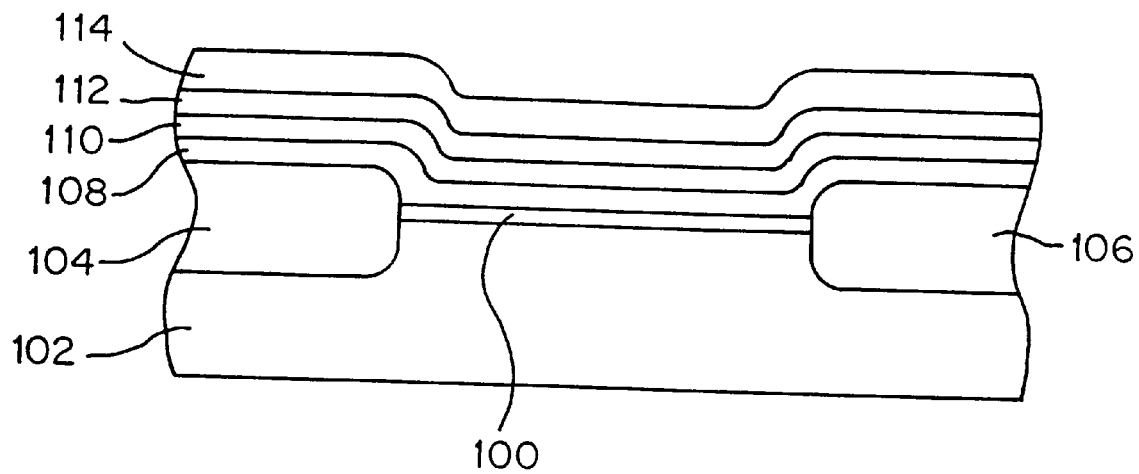
FIG. 1 is a schematic sectional view showing the results of progressive formations of layers during the fabrication of a stacked gate structure according to the present invention.

FIG. 1 shows an intermediate stage of the fabrication of a stacked gate according to an embodiment of the present invention. At this stage of the fabrication a blanket oxide layer 100 is formed on an active semiconductor region 102 of a semiconductor substrate, using a well-known technique such as oxidation of a superficial layer of the semiconductor substrate 102. Silicon dioxide ($SiO_2$) isolation regions 104 and 106 are developed in the illustrated manner and are covered with a layer of doped polysilicon 108. Following this, an interpoly dielectric (e.g. an ONO—Oxide/Nitride/Oxide) layer 110 is grown over the top of the polysilicon layer using a conventional technique. This is in turn followed by a layer of tungsten metal (W) 112 and a cap layer of tungsten silicide ($WSi_x$) 114. The cap layer 114 is provided to protect the metallic layer 112 which is prone to oxidation and which therefore requires protection. The interposition of the metallic tungsten layer 112 between the tungsten silicide layer 114 and the ONO layer 110 improves adhesion and attenuates lifting of the tungsten silicide layer while providing a low resistivity.

Figure 2:
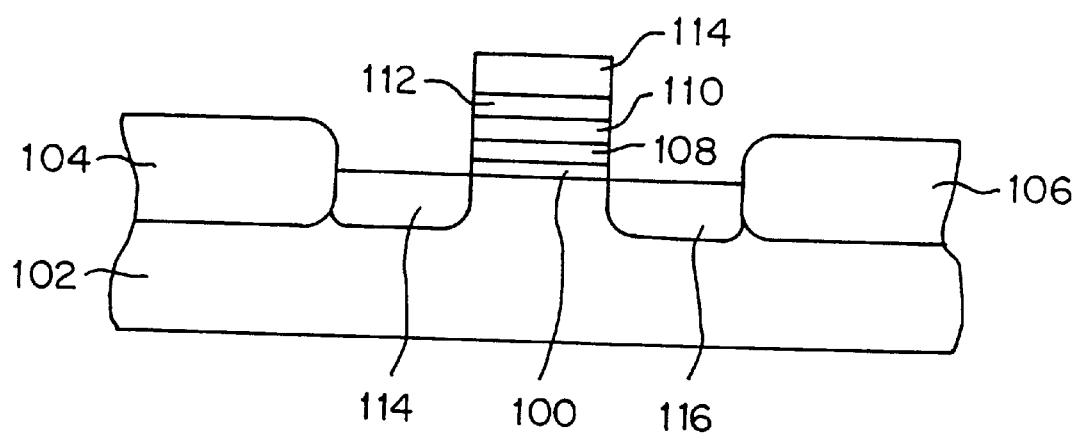
FIG. 2 is a schematic sectional view showing the gate electrode at an intermediate stage of its fabrication.

Following this, masking and etching are used to remove the portions of the layers and in a manner which leaves a stack of the nature depicted in FIG. 2. Source and drain regions 114, 116 are formed by masking and implanting a suitable dopant species into the active region of the semiconductor substrate at about 1E13 to about 5E16 ions per square centimeter dose at an implantation energy level of about 10–180 keV. In the illustrated embodiment, the dopant is phosphorous.

Figure 3:
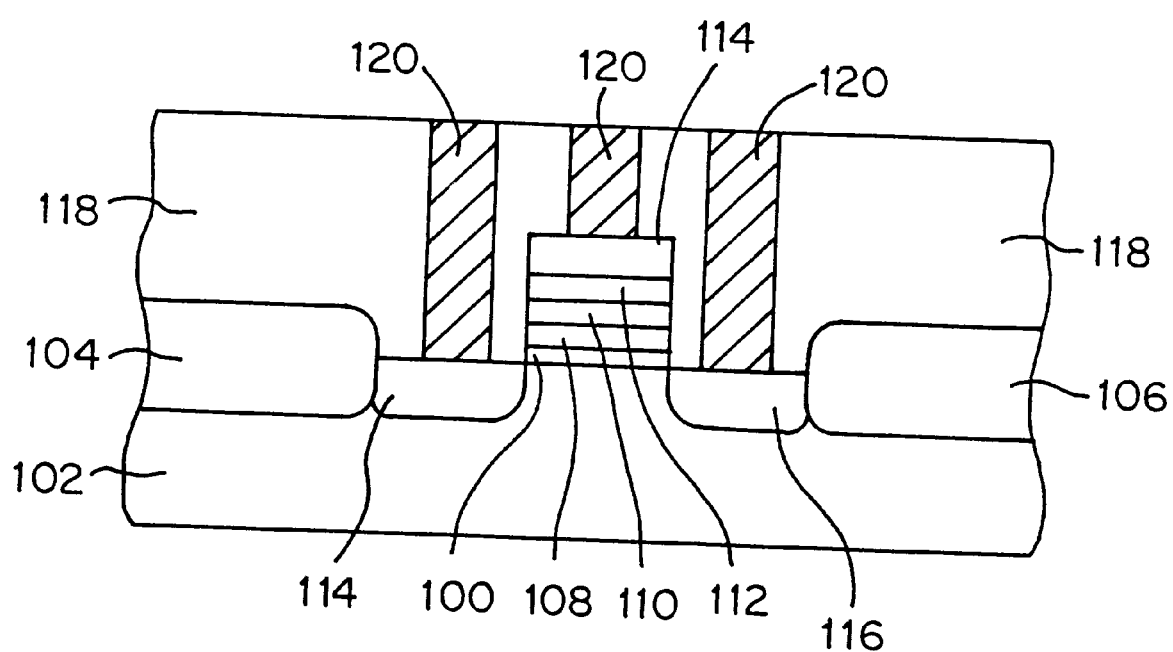
FIG. 3 is a schematic sectional view showing the completed gate electrode.

In this stack structure the polysilicon layer 108 acts as a floating gate while the tungsten/tungsten silicide layers 112, 114 act as a control gate. This gate structure is then encased in a dielectric layer 118 in the manner illustrated in FIG. 3. Openings are formed through this dielectric layer 118 using a suitable conventional etching technique and are filled with an electrically conductive material 120 such as aluminum, metal alloy or a heavily doped polysilicon in a conventional manner, such as thermal evaporation, electron beam assisted evaporation, CVD, and PVD sputtering.

In accordance with the illustrated embodiment, the tunnel oxide layer is formed as a blanket so as to have a thickness of about 25 Å to about 200 Å, while the polysilicon layer has a thickness of about 500 Å to about 2000 Å, and is formed using a CVD technique wherein deposition is carried out at 450–750° C., a pressure of 0.5–10 Torr. This polysilicon layer is doped with $PH_3$ using a LPCVD technique wherein the concentration is 1E15–1E17.

The interpoly dielectric (e.g. ONO—Oxide/Nitride/Oxide) layer 110 is then formed in a conventional manner and has an average gate thickness of about 50 Å to about 150 Å.

The tungsten layer is formed using a CVD technique which is carried out at a pressure of 40–80 Torr, and 350–450° C. so as to have a thickness of about 500 Å to about 1500 Å. The tungsten silicide layer, on the other hand, is formed using a mixture of $WF_6$ and $SiH_4$ gases wherein the flow rate of $WF_6$ is generally less than 25 sccm while the flow rate of higher order silanes such as disilane and trisilane, is generally less than 400 sccm. The temperature in this instance is maintained at about 370° C. The thickness of the $WSi_x$ is from about 500 Å to about 2000 Å.

The formation of these tungsten and tungsten silicide layers can conveniently be formed in situ in the same reaction chamber using a PECVD and/or a LPCVD techniques. In accordance with the present invention the tungsten silicide ($WSi_x$) is such that x=1.7–2.7.

Figure 4A:
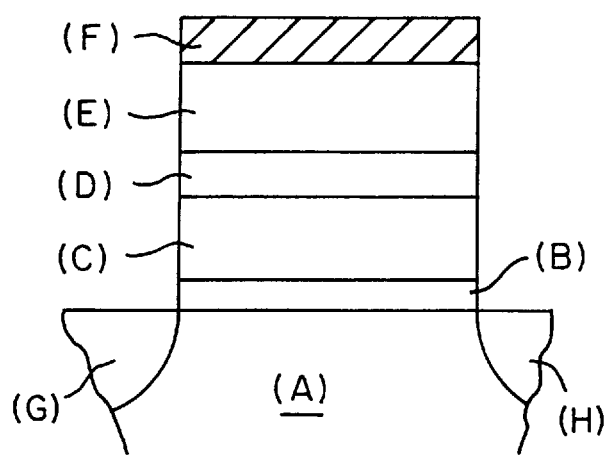
FIGS. 4A and 4B are schematic side views demonstrating the stack height of a prior art arrangement and that which is possible with the present invention.
Figure 4B:
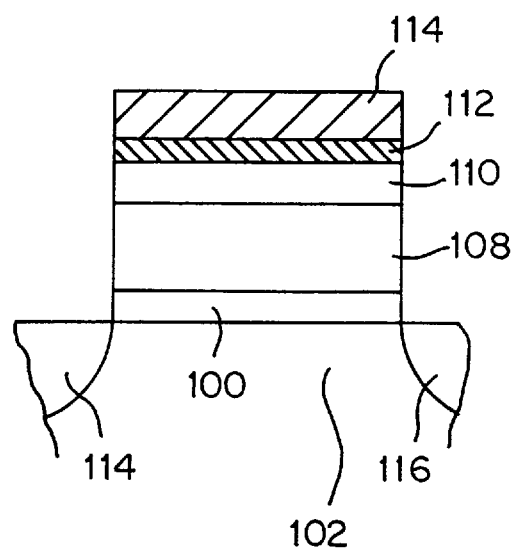

FIGS. 4A and 4B compare the structures which are achieved using the prior art technique and that which characterizes the present invention. In FIG. 4A, which depicts the prior art, a substrate (A) has a tunnel oxide layer (B) formed thereon. This layer (B) is sequentially covered with a first polysilicon layer (C), an ONO layer (D), a second polysilicon layer (E) and a tungsten silicide layer (F). Doped source and drain regions are respectively denoted by the letters (G) and (H). Although these layers are not drawn to scale, it will be still appreciated that the overall height of the invention which is represented by FIG. 4B is lower in height due to the replacement of the second polysilicon layer. For example, conventional double polysilicon/ONO stacked gate electrodes typically extend about the main surface of a substrate to a height of about 1500 Å to about 3000 Å while stacked gate electrodes of the present invention extend to a height of about 1500 to about 3000.

It is submitted that given the preceding disclosure, one of skill in the art to which the present invention pertains would be able to make and practice the invention without recourse to undue experimentation, in that all of the steps which are used, are know and/or commonly used in the fabrication of semiconductor devices. Further, although the invention has been disclosed with reference to only one example of the invention, the various modifications and changes which can be made without departing from the invention, which is limited only by the appended claims, will be readily apparent to those skill in this art.

What is claimed is:

1. A method of manufacturing a semiconductor device comprising a gate structure, the method comprising:

forming a polysilicon layer on a tunnel oxide layer;

forming an interpoly dielectric layer over the polysilicion layer;

forming a tungsten layer on the polysilicon layer; and forming a tungsten silicide layer on the tungsten layer.

2. The method as set forth in claim 1, further comprising the steps of:

removing selected portions of said polysilicon layer, said interpoly dielectric layer, said tungsten layer, said tungsten silicide layer, and said tunnel oxide layer;

doping portions of an underlying substrate to form source and drain implants; and depositing a dielectric layer.

3. The method as set forth in claim 2, further comprising: forming first, second and third openings through the dielectric layer and filling the openings with an electrically conductive material so as to establish electrical contact with the source, the drain and said tungsten silicide layer respectively.

4. A semiconductor device having a gate comprising:

a tunnel oxide layer formed on a main surface of a substrate;

a polysilicon layer formed on the tunnel oxide layer;

an interpoly dielectric layer formed over the polysilicion layer;

a tungsten layer formed on the polysilicon layer; and a tungsten silicide layer formed on the tungsten layer.

5. The semiconductor device as set forth in claim 4, further comprising:

source and drain portions formed by removing selected portions of said polysilicon layer, said interpoly dielectric layer, said tungsten layer, said tungsten silicide layer, and said tunnel oxide layer and doping portions of an underlying substrate to form source and drain portions; and an encasing dielectric layer formed over the source and drain portions, and the stack of tunnel oxide, polysilicon, interpoly dielectric, tungsten and tungsten silicide.

6. A semiconductor device as set forth in claim 5, further comprising:

first, second and third openings formed through the encasing dielectric layer so as to respectively terminate at the source, the drain and said tungsten silicide layer respectively, said first, second and third openings being filled with an electrically conductive material so as to establish electrical contact with the source, the drain and said tungsten silicide layer respectively.

7. The semiconductor device according to claim 4, wherein the gate structure also extends above the main surface to a height no greater than about 1500 Å to about 3000 Å.

8. The semiconductor device according to claim 7, wherein:

the tungsten layer has a thickness of about 500 to about 1500; and the tungsten silicide layer has a thickness of about 500 to about 2000.

* * * * *